（12）United States Patent
Chmelar et al.

(10) Patent No.: US 7,696,915 B2
(45) Date of Patent: Apr. 13, 2010

(54) ANALOG-TO-DIGITAL CONVERTER HAVING REDUCED NUMBER OF ACTIVATED COMPARATORS

(75) Inventors: Erik Chmelar, Midland, MI (US); Choshu Ito, San Mateo, CA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 12/108,791

(22) Filed: Apr. 24, 2008

(65) Prior Publication Data

US 2009/0267821 A1 Oct. 29, 2009

(51) Int. Cl.
*H03M 1/36* (2006.01)

(52) U.S. Cl. ................................. 341/159; 341/160

(58) Field of Classification Search .......... 341/159–160
See application file for complete search history.

(56) References Cited

U.S. PATENT DOCUMENTS

| | | | | |
|---|---|---|---|---|
| 5,296,856 A | * | 3/1994 | Mantong | 341/139 |
| 6,002,356 A | * | 12/1999 | Cooper | 341/160 |
| 6,081,219 A | * | 6/2000 | Prasanna | 341/159 |
| 6,373,423 B1 | * | 4/2002 | Knudsen | 341/159 |
| 6,404,372 B1 | * | 6/2002 | Heithoff | 341/155 |
| 6,603,416 B2 | * | 8/2003 | Masenas et al. | 341/120 |
| 6,980,140 B1 | * | 12/2005 | Rowland et al. | 341/118 |

* cited by examiner

*Primary Examiner*—Khai M Nguyen
(74) *Attorney, Agent, or Firm*—Ryan, Mason & Lewis, LLP

(57) ABSTRACT

An ADC circuit includes multiple comparators and a controller coupled to the comparators. Each of the comparators is operative to generate an output indicative of a difference between a first signal representative of an input signal applied to the ADC circuit and a corresponding reference signal. The controller is operative to perform at least one of: (i) activating a subset of the comparators during a given sample period being; and (ii) controlling levels of the corresponding reference signals of the comparators as a function of a level of the input signal. A number of active comparators during the given sample period is no greater than one less than a number of regions into which the input signal is quantized.

20 Claims, 10 Drawing Sheets

900

ANALOG-TO-DIGITAL CONVERTER HAVING REDUCED NUMBER OF ACTIVATED COMPARATORS

FIELD OF THE INVENTION

The present invention relates generally to the electrical and electronic arts, and more particularly relates to analog-to-digital conversion.

BACKGROUND OF THE INVENTION

An analog-to-digital converter (ADC) is a circuit that samples and converts an analog signal to a digital signal. With respect to the allowable or meaningful signal values, an analog signal is continuous while a digital signal is discrete or quantized. Usually, the signals are represented by voltage levels, varying in a continuous fashion over some specified voltage range for analog signals and discrete specified quantized levels for digital signals. An important characteristic of an ADC is its resolution, which is a function of the number of quantized voltage levels to which the analog input signal may be assigned. Resolution thus describes the fineness of the quantization performed by the ADC. Generally, the higher the resolution of the ADC, the more accurate the digital representation of the analog signal will be. A high resolution ADC divides the input range into a larger number of subranges than a low resolution converter. Resolution is usually defined as the base 2 logarithm of the number of subranges the ADC input range has been divided into.

In most applications, it is either desired or required to have as high an ADC resolution as practical. However, increased resolution also increases the likelihood that the ADC output will not be a pure thermometer code. A thermometer code works similarly to a thermometer in that if comparator outputs in the ADC are listed in a column and ordered according to increasing reference values associated with the respective comparators that produced them, the level of a boundary between logic "1's" and logic "0's" would indicate the value of the analog input signal, much as a level of mercury in a mercury thermometer indicates the temperature. By way of example, a high resolution ADC may produce an output of 1101000, which deviates from a thermometer code by the third numeral from the left being 0 instead of 1. This may result from, for example, noise and offsets due to process, voltage, temperature, etc. being larger than the difference in adjacent reference levels between two comparators in the ADC, thus causing a comparator to make an incorrect decision. Consequently, the complexity of an encoder in an ADC system becomes prohibitive in terms of both the hardware required to encode the output of the ADC and the latency of the encoding computation. Furthermore, for each additional encoded bit of the digitized code, twice the number of comparators is needed, thereby increasing the power and/or area of the ADC, which is undesirable.

Conventionally, channel equalization, for example, decision feedback equalization (DFE) or feed-forward equalization (FFE), is sometimes used in communication systems to determine the correct bit sequence of the ADC output. To determine the correct bit value during a given bit period, equalization modifies the current sampled value by a function of the values determined during some number of previous or later-occurring bit periods. Unfortunately, if an incorrect decision is made during some bit period, the error will likely accumulate to cause more incorrect decisions.

An alternative technique to determine the proper bit sequence is to use a maximum likelihood (ML) detector, for example a Viterbi encoder. ML detectors determine the correct bit value during a given bit period by calculating the maximum likelihood of the bit value (for example, either logic "0" or logic "1") based on the sampled value and the previous sequence of bits. ML detectors are disadvantageous primarily because they require substantial hardware to implement.

Signal degradation due to the channel or systems can sometimes be handled by the transmitting system. One common way a transmitting system does this is to use signal shaping techniques, such as, for example, pre-emphasizing high frequency components of the transmitted signal, $v_{tx}(t)$, or de-emphasizing low frequency components of $v_{tx}(t)$. Unfortunately, signal shaping techniques often add significant noise to the signal, which is undesirable. Even aggressive pre-emphasis may not be sufficient in many systems to permit the receiver to recover the proper bit sequence.

Accordingly, there exists a need for improved analog-to-digital conversion techniques which do not suffer from one or more of the above-described problems associated with conventional analog-to-digital conversion techniques.

SUMMARY OF THE INVENTION

Illustrative embodiments of the present invention meet the above-noted need by providing circuits, methods and techniques for advantageously reducing power consumption in an ADC circuit without significantly degrading performance of the ADC circuit, such as, for example, resolution. To accomplish this, embodiments of the invention beneficially reduce the number of comparators that are activated (e.g., turned on) during any given sample period and dynamically control corresponding reference signal levels supplied to the comparators.

In accordance with an aspect of the invention, an ADC circuit includes multiple comparators and a controller coupled to the comparators. Each of the comparators is operative to generate an output indicative of a difference between a first signal representative of an input signal applied to the ADC circuit and a corresponding reference signal. The controller is operative to perform at least one of: (i) activating a subset of the comparators during a given sample period being; and (ii) controlling levels of the corresponding reference signals of the comparators as a function of a level of the input signal. A number of active comparators during the given sample period is no greater than one less than a number of regions into which the input signal is quantized.

In accordance with another aspect of the invention, a method for reducing power consumption in an ADC circuit is provided. The method includes the steps of: defining a plurality of regions into which an analog input signal applied to the ADC circuit is quantized; performing at least one of: activating a subset of the plurality of comparators during a given sample period; and controlling levels of the corresponding reference signals of the comparators as a function of a level of the input signal; and generating an output signal as a function of respective outputs of active comparators in the ADC circuit during a given sample period, the output signal for the given sample period being a digital representation of the analog input signal. A number of active comparators during the given sample period is no greater than one less than a number of regions into which the input signal is quantized.

In accordance with yet another aspect of the invention, an electronic system includes at least one integrated circuit having one or more ADC circuits. At least one of the ADC circuits includes multiple comparators, each of the comparators being operative to generate an output indicative of a difference between a first signal representative of an input signal applied to the ADC circuit and a corresponding reference signal. The ADC circuit further includes a controller coupled to the plurality of comparators. The controller is operative to activate a subset of the plurality of comparators during a given sample period and/or to control levels of the corresponding reference signals of the comparators as a function of a level of the input signal. A number of active comparators during the given sample period is no greater than one less than a number of regions into which the input signal is quantized.

These and other features, objects and advantages of the present invention will become apparent from the following detailed description of illustrative embodiments thereof, which is to be read in connection with the accompanying drawings.

DETAILED DESCRIPTION OF THE INVENTION

The present invention will be described herein in the context of exemplary ADC circuits, systems and method for use therewith. It is to be understood, however, that the techniques of the present invention are not limited to the circuits, systems and method shown and described herein. Rather, embodiments of the invention are directed to techniques for reducing power consumption in an ADC circuit without significantly impacting performance (e.g., resolution) and/or area of the circuit. Although preferred embodiments of the invention may be fabricated in a silicon wafer, embodiments of the invention can alternatively be fabricated in wafers comprising other materials, including but not limited to gallium arsenide (GaAs), indium phosphide (InP), etc.

Figure 1:
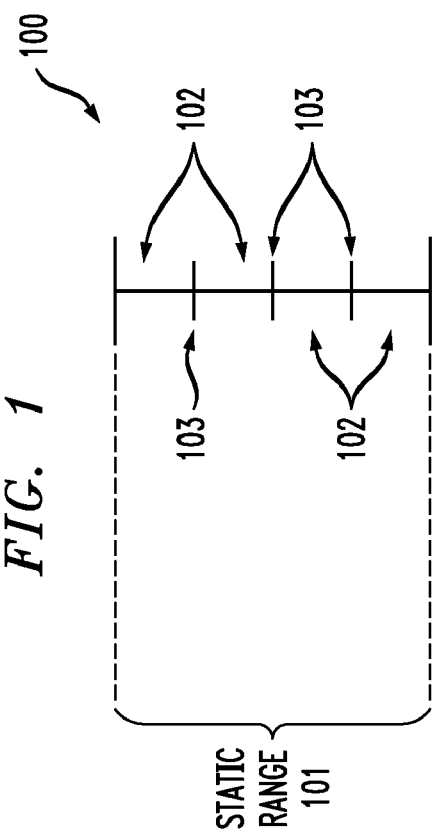
FIG. 1 is an exemplary diagram illustrating one method of dividing a static signal range into multiple regions.

FIG. 1 is an exemplary diagram 100 illustrating one method of dividing a static signal range into multiple regions. With reference to FIG. 1, an ADC operates over a static (fixed), specified input signal range 101. Usually the static range over which the ADC operates is substantially the same as the input analog signal range. This static range 101 may be quantized into n regions 102, demarcated by n−1 reference levels 103, where n is an integer greater than one. For example, as shown in the figure, static range 101 is divided into four regions 102 by three reference levels 103. The quantization regions 102 are preferably of equal size relative to one another, although regions of differing size are similarly contemplated.

Figure 2:
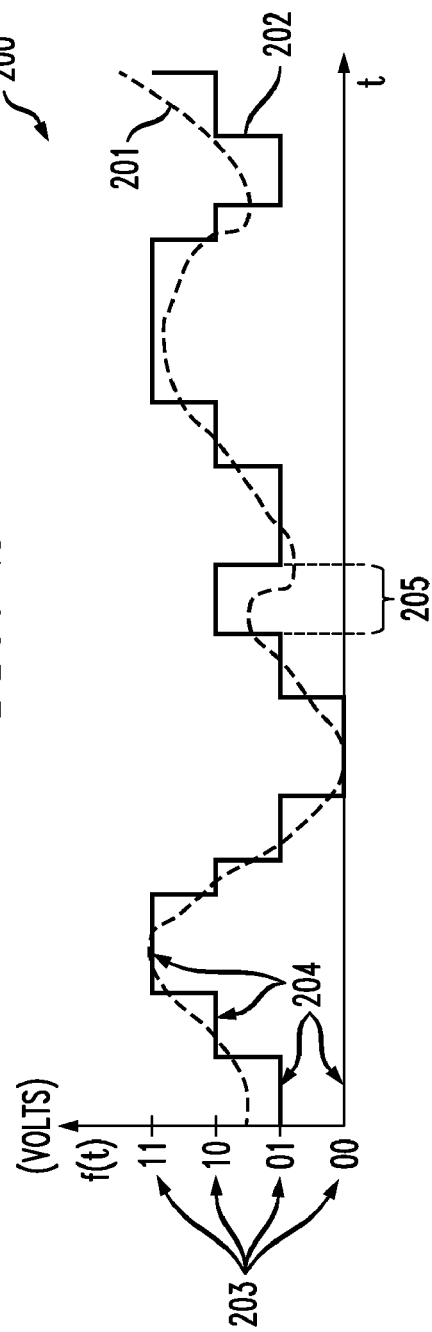
FIG. 2 is a graphical illustration depicting an exemplary analog signal, which may be an input signal to an ADC, and a corresponding digital signal, which may be an output signal generated by the ADC.

FIG. 2 is a graphical illustration 200 depicting an exemplary analog signal 201, which may be an input signal to an ADC, and a corresponding digital signal 202, which may be an output signal generated by the ADC. Encoded values 203 which may be in the form of a digital word corresponding to quantized voltage levels 204 of the digital signal 202 are shown. In this illustration, digital signal 202 is quantized into one of four discrete voltage levels 204, which can be represented by two bits (e.g., 2-bit resolution), during a given sample period 205. The sample period 205 may be defined herein as the time duration during which the ADC samples the analog signal 201. The sample period 205 is the duration of the resultant digital signal 202 for that sample or bit. The digital signal values over time reflect analog signal levels at corresponding times. The difference between the actual analog value and quantized digital value is called quantization error. This error is due either to rounding or truncation. Generally, quantization error decreases as the number of discrete voltage levels to which the analog signal 201 can be quantized (i.e., resolution) increases.

Figure 3:
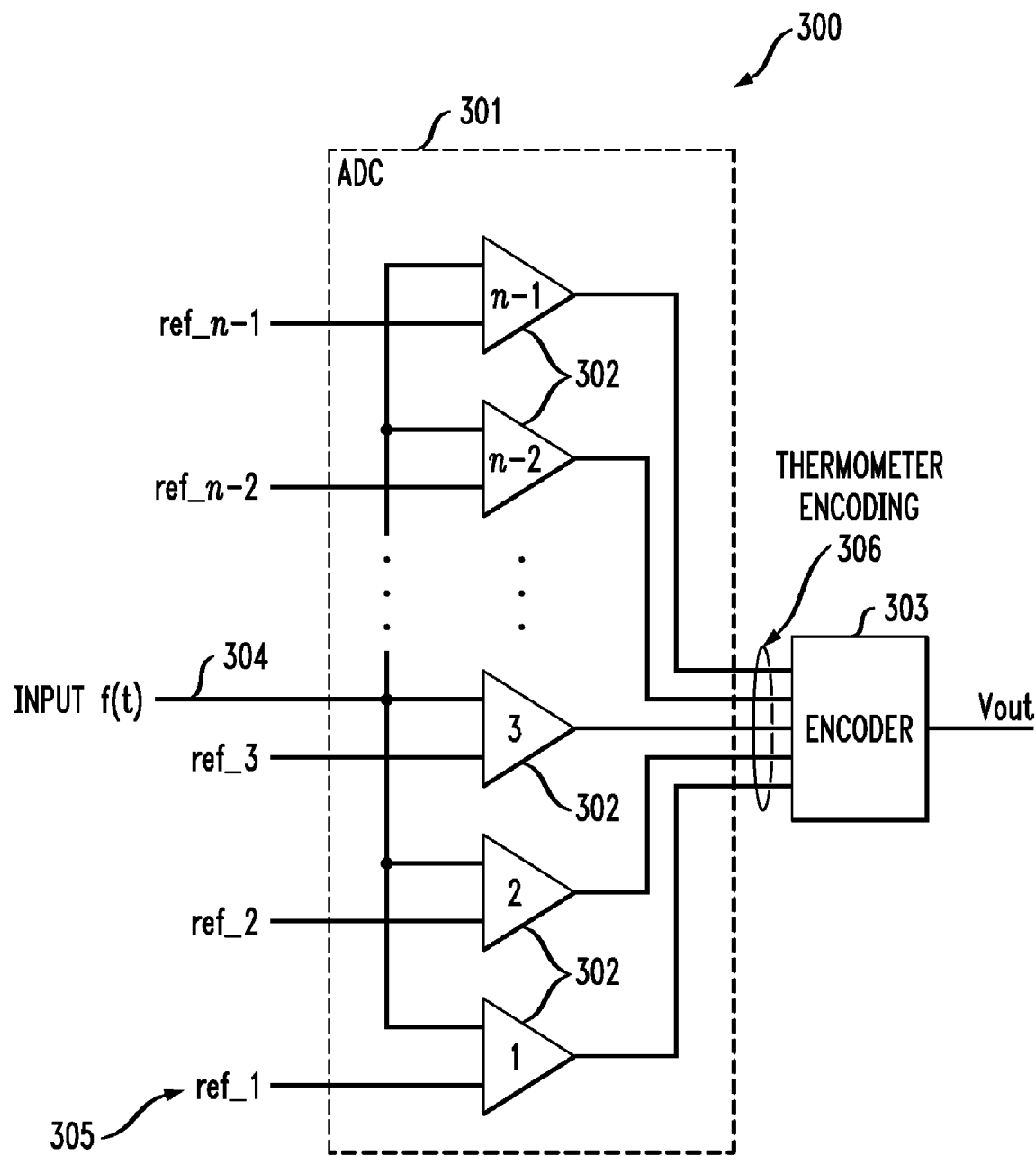
FIG. 3 is a schematic diagram depicting an exemplary ADC circuit which can be modified to implement techniques of the present invention.

One type of ADC circuit is a flash ADC circuit, an example of which is shown in FIG. 3. FIG. 3 is a schematic diagram depicting an exemplary flash ADC circuit 300 which can be modified to implement techniques of the present invention. With reference to FIG. 3, the exemplary ADC circuit 300 employs an ADC 301 and an encoder 303 coupled to the ADC. ADC 301 includes a bank of n−1 comparators 302, where n is an integer greater than 1. Each comparator 302 has a first input adapted to receive an analog signal, f(t), and a second input adapted to receive a corresponding reference signal 305 (e.g., signals ref_1 through ref_n−1). Each comparator 302 is operative to sample the analog signal f(t), to compare the sampled analog signal to its corresponding reference signal, and to generate an output signal indicative of whether or not a level of the sampled analog signal is greater than (e.g., logic "1") or less than (e.g., logic "0") a level of the corresponding reference signal. The output of the ADC is therefore a thermometer code, for example 1110000. Respective outputs of the comparators 302 form a composite signal 306.

Encoder 303 preferably receives the composite signal 306 and converts it to a desired representation of the digital signal. This may be in the form of a simple binary number. For example, the composite signal 306 having a thermometer code 1110000 could be converted to the binary number 101, which would be output from the encoder 303 as output signal Vout. The encoder 303 may also function to correct the composite signal 306 when it has errors in one or more of its components. For example, a composite signal 306 having a digital code 1110010 would not be a thermometer code as expected, and therefore an error is assumed to be present. More particularly, the sixth bit position from the left should be a logic 0 rather than a logic 1 in order for the composite signal 306 to be a thermometer code. The encoder 303 may function to correct this detected error thereby producing the correct output, for example 101. The encoder 303 may construct a single or multiple bit sequential digital signal corresponding to the input analog signal f(t) applied to the ADC system 300. Other types of encoding, error correction and/or computation by encoder 303 are also possible, as will become apparent to those skilled in the art.

Figure 4:
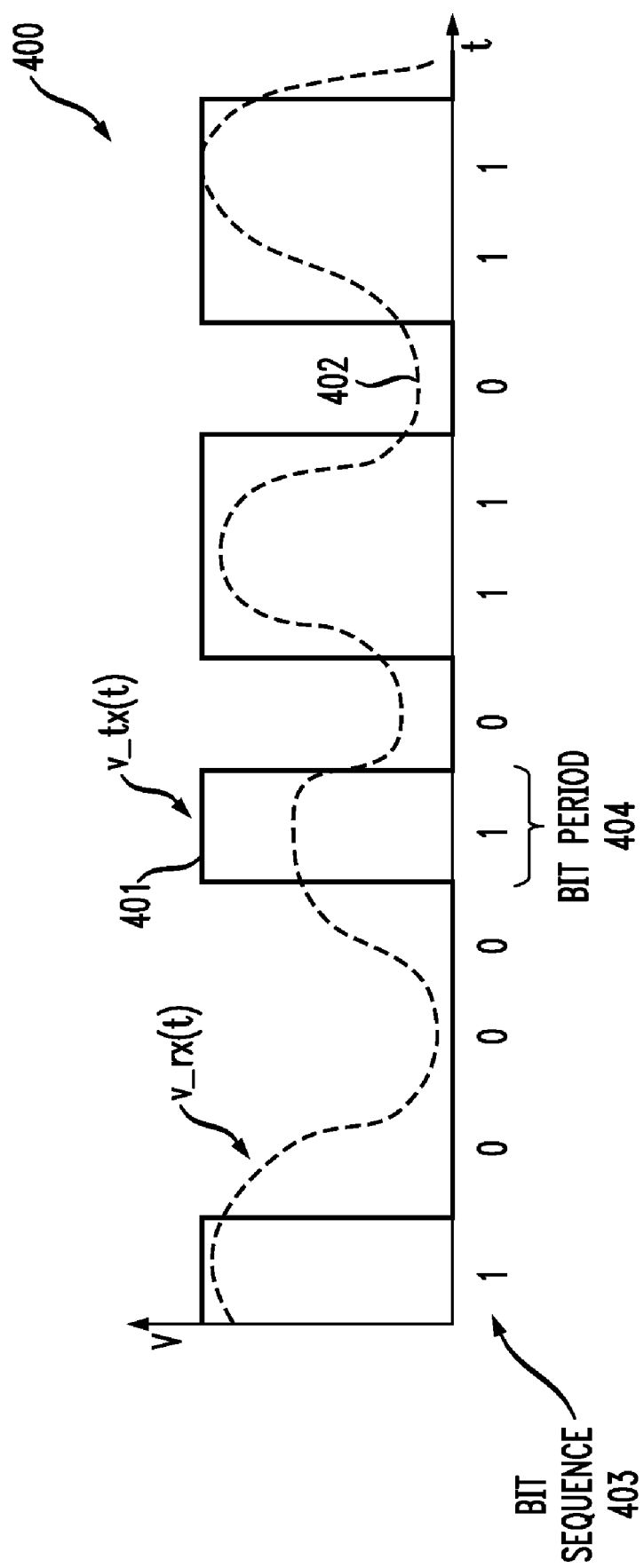
FIG. 4 is a graph of an exemplary distorted signal and its corresponding exemplary digital signal reconstructed by an ADC system.

In the context of a digital communication system, an ADC may be used in a receiver to recover an originally transmitted digital signal. With reference to FIG. 4, diagram 400 illustrates an exemplary digital signal 401, which may be sent by a transmission system (e.g., transmitter), and a corresponding analog signal 402, which may be received by a receiving system (e.g., receiver) employing one or more ADCs. For simplicity and without loss of generality, assume that an input signal f(t) to the ADC (e.g., ADC 301 in FIG. 3) is a voltage, v_rx, which varies as a function of time, t, such that f(t)=v_rx (t). This signal may be represented in FIG. 4 as analog signal 402. Signal v_rx(t) may have originated from a digital signal, v_tx(t), transmitted from some transmission system but that has become distorted as a result of the transmission process. This transmitted signal v_tx(t) may be represented as digital signal 401. Thus, received signal v_rx(t) may be a distorted (e.g., attenuated and/or noisy) version of transmitted signal v_tx(t). Various causes of such distortion may include, but are not limited to, characteristics of a channel between the transmission system and the receiving system (e.g., which can act as a low pass filter to signal v_tx(t)), additive jitter, noise, inter-symbol interference (ISI), crosstalk, etc.

The receiver should be able to recover, or reconstruct, the original transmitted signal v_tx(t) from the received signal v_rx(t). By way of example, assume that signal v_tx(t) represents some digital data, such as bit sequence 403, and the receiver must determine what bit sequence was originally transmitted. A bit period 404 may be defined as the duration of time over which the signal v_tx(t) remains constant; that is, it is the time duration of a bit of data. This bit period 404 may be known a priori by the receiving system.

ADCs use a large number of comparators to achieve a high resolution. As previously stated, A comparators are required to achieve a resolution of A+1 analog signal input regions (see, e.g., FIG. 1). This is inefficient, at least in terms of power consumption, because frequently the input signal does not cross the respective reference levels of many of the comparators between consecutive bit sample periods. Thus, most of the comparators are consuming power in the ADC to sample the analog input signal but contribute little since the outcome of the sampling is substantially the same as it was during the previous sample period. Therefore, in order to conserve power in the ADC, it is more efficient to define a range of the input signal for which only a subset of the total number of comparators (e.g., two comparators) are active during any given sample period.

In accordance with a first aspect of the invention, one way to achieve this is to activate (e.g., turn on or clock) only a small subset of a larger set of comparators in the ADC. In other words, a comparators out of the total of A comparators in the ADC are activated during any given sample period, where a<A. In accordance with a second aspect of the invention, an alternative way to achieve reduced power consumption in the ADC is to employ only a small number of comparators, a, in the ADC compared to a larger number of comparators, A, that would otherwise be required for a given resolution, where a<A, and to dynamically adjust the reference voltages to these a comparators as a function of the input signal level. The reference voltages corresponding to the respective comparators can be dynamically adjusted, for example, by applying a global reference voltage offset to each of the a comparators in the ADC. The two dynamic range ADC techniques may be referred to herein as virtual and physical reference level shifting, respectively. In either case, a smaller number of comparators is active during any given sample period, thereby advantageously reducing overall power consumption in the ADC.

Figure 5:
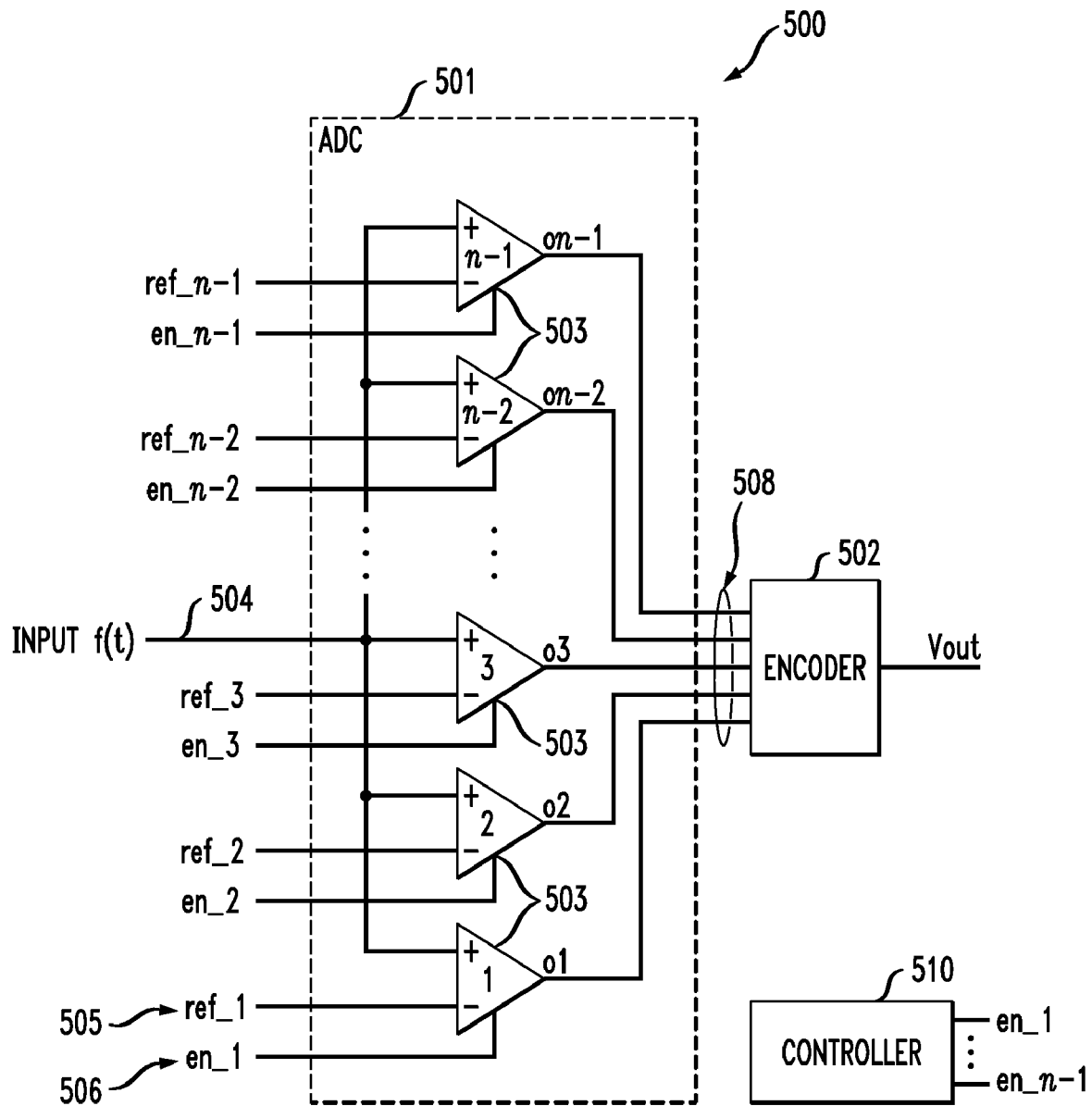
FIG. 5 illustrates at least a portion of an exemplary ADC circuit adapted to perform virtual reference level shifting, in accordance with an embodiment of the present invention.

FIG. 5 illustrates at least a portion of an exemplary ADC circuit 500 adapted to perform virtual reference level shifting, in accordance with an embodiment of the present invention. ADC circuit 500 preferably comprises an ADC 501 and an encoder 502, or alternative controller (e.g., processor), coupled to the ADC. ADC 501 includes a plurality of comparators 503, namely, comparators 1 through n−1, where n is an integer greater than two. Each comparator 503 has a first input, which may be a non-inverting (+) input, adapted to receive an analog input signal, f(t), 504 supplied to the ADC 501, a second input, which may be an inverting (−) input, adapted to receive a corresponding reference signal 505, and a third input, which may be an enable input, adapted to receive a corresponding control signal 506 for selectively activating the comparator. Each comparator 503 is operative to generate a corresponding output signal which is preferably a logical value (e.g., logic 1 or logic 0) indicative of a difference between respective voltage levels at the first and second inputs of the comparator.

More particularly, comparator 1 receives input signal f(t), a reference signal ref_1, and a control signal en_1, and generates an output signal o1; comparator 2 receives input signal f(t), a reference signal ref_2, and a control signal en_2, and generates an output signal o2; comparator 3 receives input signal f(t), a reference signal ref 3, and a control signal en_3, and generates an output signal o3; comparator n−2 receives input signal f(t), a reference signal ref_n−2, and a control signal en_n−2, and generates an output signal on−2; and comparator n−1 receives input signal f(t), a reference signal ref_n−1, and a control signal en_n−1, and generates an output signal on−1. The output signals generated by the comparators 503 form an output of the ADC 501, which may be referred to collectively as composite signal 508. Composite signal 508 may comprise a digital word.

Encoder 502 preferably includes a plurality of inputs, at least one input for each comparator 503 used in the ADC 501. Each of the inputs of encoder 502 are adapted to receive a corresponding one of the output signals 508 generated by the comparators 503. Encoder 502 is operative to receive composite signal 508 and to generate an output signal, Vout, as a function of the composite signal. Output signal Vout generated by encoder 502 is preferably a desired representation of composite signal 508; such representation may be in the form of a simple binary number.

Conventionally, in order to provide A−1 regions of resolution, A comparators are required. However, as previously explained, not all comparators need to be active during any given sample period. Thus, to reduce power consumption in the ADC circuit 500, control signals en_1 through en_n−1 are used to activate a subset, a, of comparators 503, where a is less than the total number A of comparators. One subset of comparators 503 is active during one sample period and the same or a different subset of comparators may be active during another sample period. In one embodiment of the invention, only two comparators 503 are active during any given sample period, although the invention is not limited to any specific number of comparators which are active during a given sample period. Control signals en_1 through en_n−1 may be generated within the ADC circuit 500, such as, for example, by a controller 510. Alternatively, the control signals en_1 through en_n−1 may be generated externally to the ADC circuit 500 and supplied to ADC 501.

Figure 6:
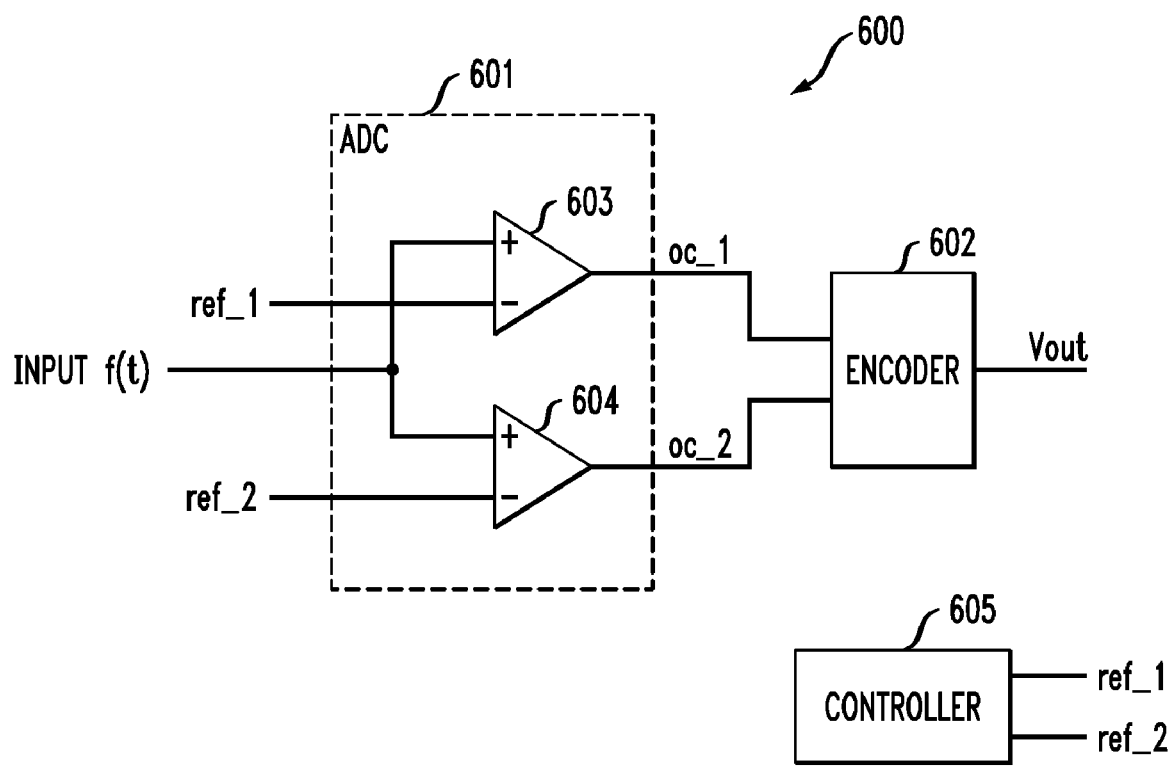
FIG. 6 illustrates at least a portion of an exemplary ADC circuit adapted to perform physical reference level shifting, in accordance with another embodiment of the invention.

FIG. 6 illustrates at least a portion of an exemplary ADC circuit 600 adapted to perform physical reference level shifting, in accordance with another embodiment of the invention. ADC circuit 600 comprises an ADC 601 and an encoder 602, or alternative controller, coupled to the ADC. ADC 601 includes first and second comparators, 603 and 604, respectively. It should be understood that although only two comparators 603 and 604 are used in this illustrative embodiment, the invention is not limited to this specific number of comparators. Rather, more comparators may be used in ADC 601, as long as the number of comparators employed, a, is less than A, where A is the number of input signal regions (see FIG. 1) minus two.

Each comparator 603 and 604 has a first input, which may be a non-inverting (+) input adapted to receive an analog input signal, f(t), supplied to the ADC 601, and a second input, which may be an inverting (−) input, adapted to receive a corresponding reference signal, ref_1 and ref_2, respectively. Preferably, reference signal ref_1 is a different level relative to reference signal ref_2. Each comparator 603 and 604 is operative to generate an output signal, oc_1 and oc_2, respectively, indicative of a difference between the input signal f(t) and the corresponding reference signals. For example, output signal oc_1 generated by comparator 603 is preferably a logic high level (logic 1) when input signal f(t) is greater than or equal to corresponding reference signal ref_1, and is a logic low level (logic 0) when f(t) is less than ref_1. Likewise, output signal oc_2 generated by comparator 604 is preferably a logic high level when input signal f(t) is equal to or exceeds corresponding reference signal ref_2, and is a logic low level when f(t) is less than ref_2. Encoder 602 includes first and second inputs adapted to receive output signals oc_1 and oc_2 generated by the first and second comparators 603 and 604, respectively. Encoder 602 is operative to generate an output signal, Vout, which is an output of the ADC circuit 600, as a function of the output signal of the ADC 601.

In contrast to the ADC circuit 500 shown in FIG. 5, in exemplary ADC circuit 600, all comparators 603 and 604 in the ADC 601 are active during all sample periods, and thus there is no need for a separate control (enable) signal for selectively activating each comparator. Instead, the reference signals ref_1 and ref_2 supplied to comparators 603 and 604, respectively, are selectively controlled as a function of a level of input signal f(t) during any given sample period. Reference signals ref_1 and ref_2 may be generated within the ADC circuit 600, such as, for example, by a controller 605. Alternatively, the reference signal may be generated externally to the ADC circuit 600 and supplied to ADC 601. Virtual reference level shifting, as performed by ADC circuit 500 (FIG. 5), and physical reference level shifting, as performed by ADC circuit 600 (FIG. 6), will be described in further detail below with reference to FIGS. 7 and 8, respectively.

Figure 7:
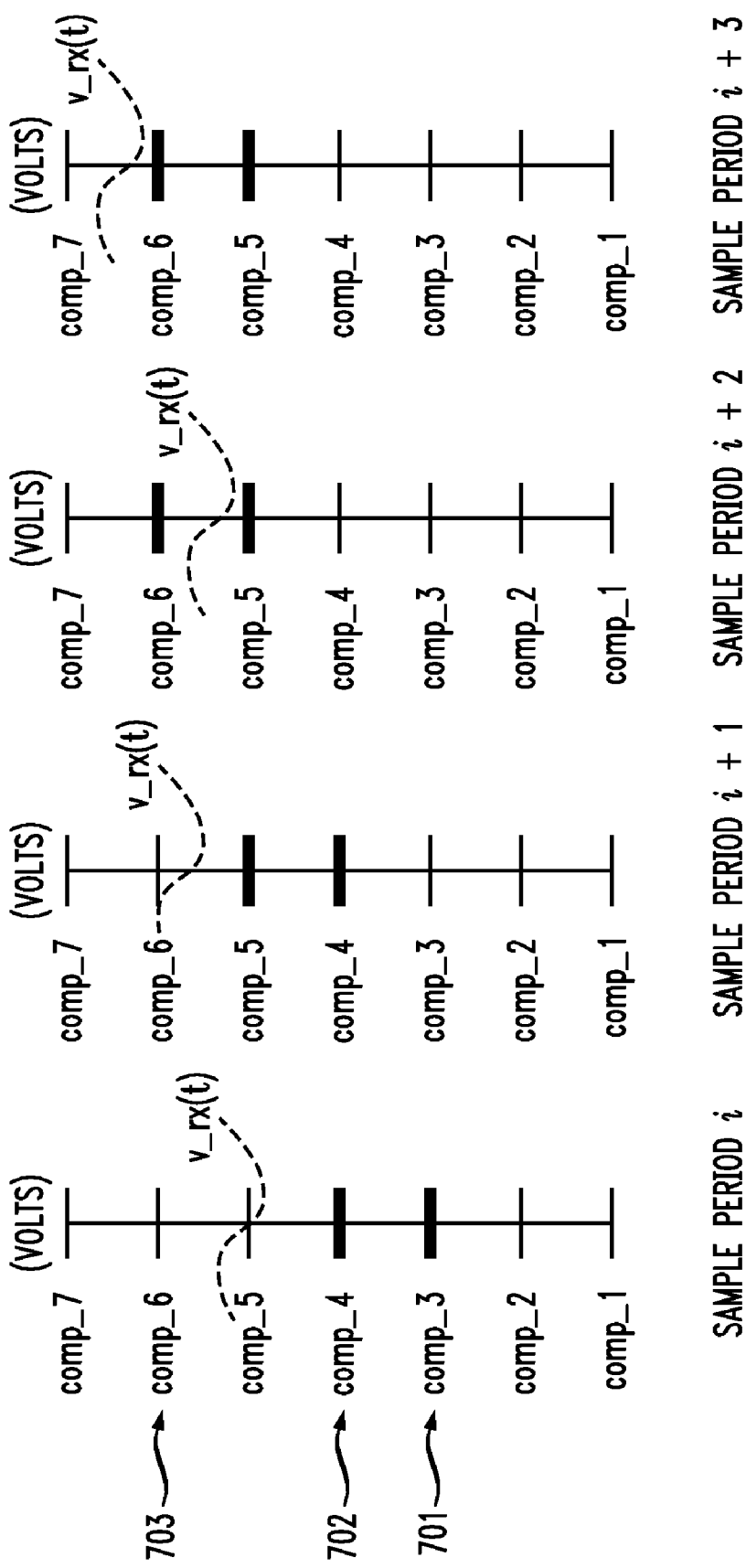
FIG. 7 depicts an exemplary virtual reference level shifting methodology, in accordance with an aspect of the invention.

FIG. 7 depicts an exemplary virtual reference level shifting methodology, in accordance with an aspect of the present invention. The virtual reference level shifting methodology 700 is shown for an ADC including seven comparators, comp_1 through comp_7, for four consecutive sample periods, namely, sample periods i, i+1, i+2 and i+3. Reference levels corresponding to active comparators for the given sample period are represented by heavy lines. Inactive comparator reference levels for a given sample period are represented by lighter lines. For example, reference levels 701 and 702 corresponding to comparators comp_3 and comp_4, respectively, are active during sample period i, and reference level 703 corresponding to comparator comp_6 is inactive during sample period i. The analog signal v_rx(t) is shown during corresponding sample periods i, i+1, i+2 and i+3. As the level of signal v_rx(t) changes, a different subset of comparators are activated accordingly. As apparent from the figure, only two comparators are active during any given sample period. As previously stated, the invention is not limited to any specific number of active comparators during a given sample period.

Figure 8:
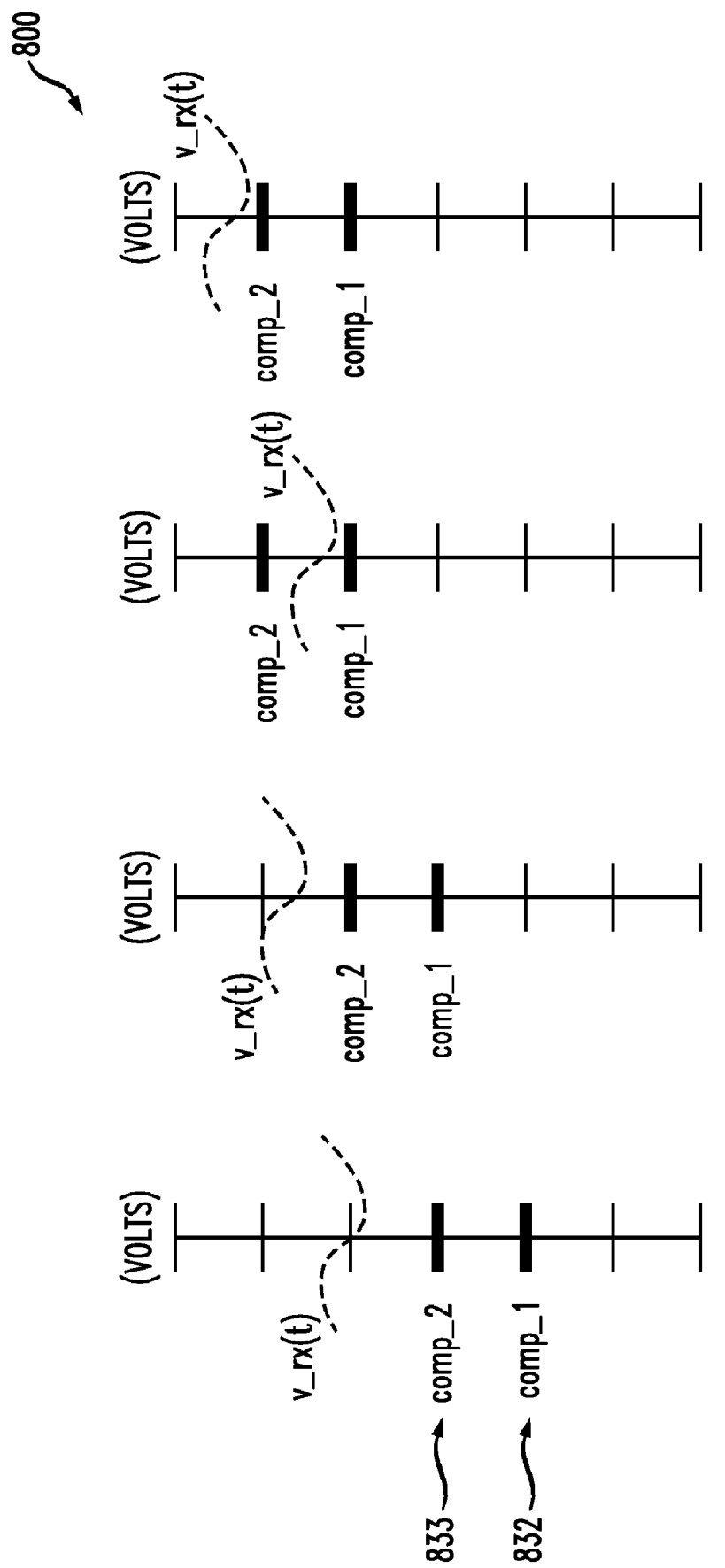
FIG. 8 depicts an exemplary physical reference level shifting methodology, in accordance with another aspect of the present invention.

FIG. 8 depicts an exemplary physical reference level shifting methodology 800, in accordance with another aspect of the invention. In this scenario, there are only two comparators, comp_1 and comp_2, both of which are active during every sample period. Four consecutive sample periods, namely, sample periods i, i+1, i+2 and i+3, are shown. It is to be understood that although only two comparators are employed in the illustrative embodiment, the invention is not limited to any specific number of comparators. Reference levels corresponding to the two comparators during any given sample period i, i+1, i+2 and i+3 are represented by heavy lines. The vertical positioning of the reference levels indicates their relative voltage levels. The analog signal v_rx(t) is shown during corresponding sample periods i, i+1, i+2 and i+3. As the level of signal v_rx(t) changes, reference levels corresponding to the two comparators comp_1 and comp_2 are adjusted accordingly.

As used herein, the term "active reference level" may be defined as the reference level associated with an active comparator. For ease of explanation, let the number of active reference levels, and thus the number of active comparators, a, during a given sample period be equal to two (a=2). It should be appreciated that more than two active comparators (e.g., a>2) may be used and may provide better performance in certain applications. Also for simplicity, the voltage difference between reference levels (i.e., spacing) is assumed to be equal, although the invention is not limited to having equally-spaced reference levels. It should be noted that, in certain applications, unequal spacing (e.g., logarithmic, binary, etc.) may provide improved performance.

The two active reference levels during a given sample period, i, can be determined as a function of the respective outputs of the two active comparators during the previous sample period, i−1, and the respective bit values determined by the ADC in the previous j sample periods, where j≧1. The term "bit value," which may also be referred to as "sample value," as used herein can be defined as the binary output of the ADC during a given sample period. The amount of reference level shifting is referred to herein as the "step size." The step size need not be constant. Rather, the step size can be a function of the respective outputs of the a active comparators in the current and previous j sample periods and the sample values determined and output by the ADC in the previous k sample periods. More particularly, the step size is preferably determined by the following expression:

$$\text{step\_size}_{i+1} = f([cp_{i1}, \ldots, cp_{ia}], [cp_{(i-1)1}, \ldots, cp_{(i-1)a}], [cp_{(i-j)1}, \ldots, cp_{(i-j)a}], [\text{bit}_i, \ldots \text{bit}_{i-k}]),$$

where $cp_{(i-n)M}$ is the output of comparator M during sample period i−n, and $\text{bit}_{i-k}$ is the bit value determined in the previous i−k sample period. Let $\text{step\_size}_i$ be the step size calculated and applied immediately after sample period i−1 for adjustment of the reference levels immediately prior to sample period i.

Figure 9:
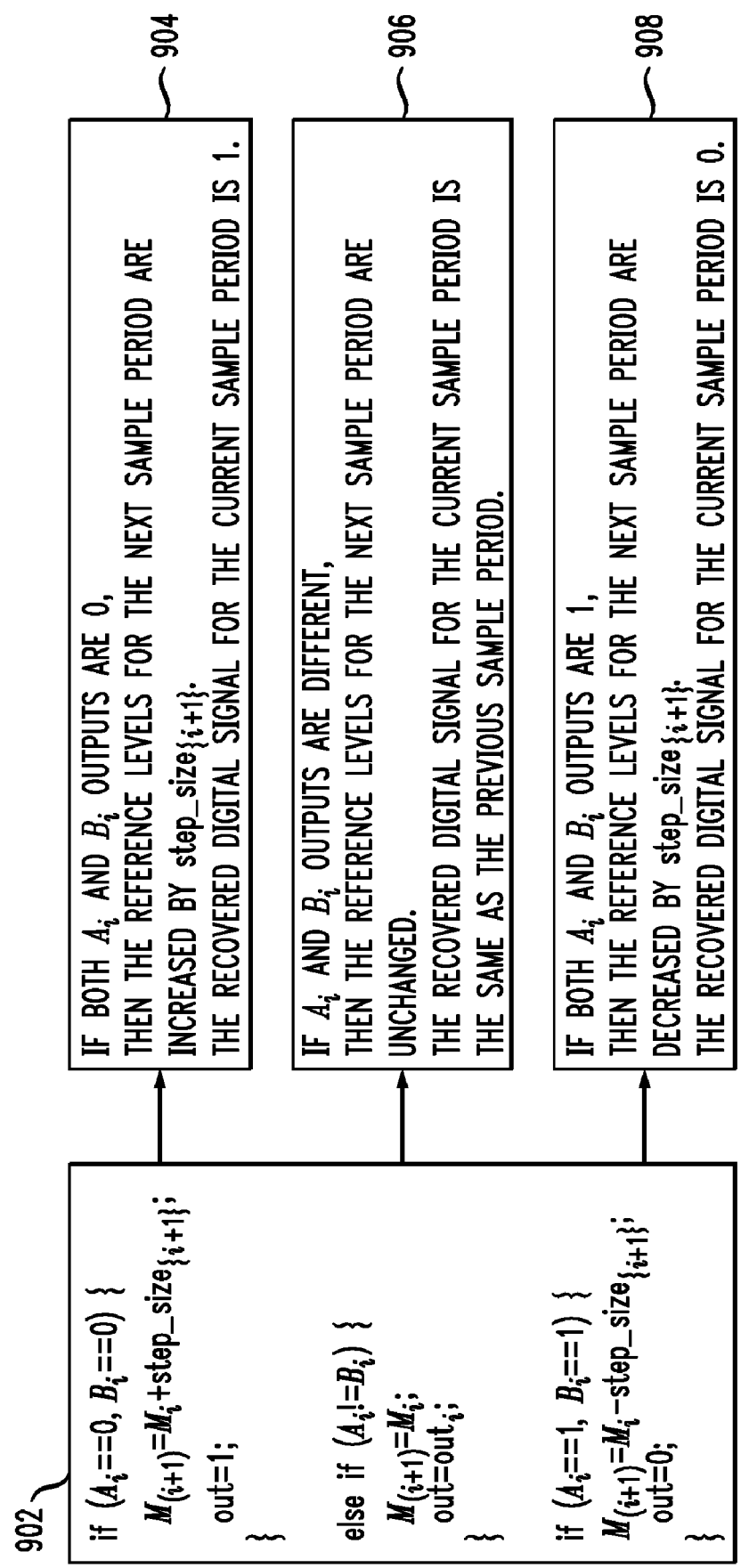
FIG. 9 illustrates a flow diagram depicting at least a portion of an exemplary method for determining reference levels of active comparators in an ADC and for recovering a digital signal from a distorted analog input signal, in accordance with an embodiment of the present invention.

FIG. 9 illustrates a flow diagram depicting at least a portion of an exemplary method 900 for determining reference levels of active comparators in an ADC circuit and for recovering a digital signal from a distorted analog input signal supplied to the ADC circuit, in accordance with an embodiment of the invention. Corresponding exemplary pseudocode 902 is also shown for implementing the method 900. It is to be understood that various alternative means for implementing the methodology are contemplated, as will become apparent to those skilled in the art given the teachings herein. For both virtual reference level shifting (FIG. 7) and physical reference level shifting (FIG. 8), let comparators $A_i$ and $B_i$ be the active comparators during a given sample period i. Additionally, let $M_i$ be a prescribed variable reference point, such as, for example, a midpoint, between the two reference levels corresponding to comparators $A_i$ and $B_i$, such that $M_i$ represents the active reference levels during sample period i.

During sample period i, when both comparators $A_i$ and $B_i$ have outputs of logic 0 (e.g., logic low, which may be zero volts), then the reference levels of both comparators are below the analog input signal level, and the reconstructed digital signal generated by the ADC circuit has a value of logic 1 (e.g., logic high, which may be a positive voltage supply of the ADC circuit). In this case, the reference levels are preferably increased by at least one step size prior to the next sample period, i+1. Specifically, for sample period i+1, the reference levels will be described by $M_{(i+1)} = M_i + \text{step\_size}_{(i+1)}$. This is depicted in step 904. Alternately, during sample period i, when one comparator has an output of logic 0 and the other comparator has an output of logic 1, the analog input signal level is between the reference levels of the two comparators, and the reconstructed digital signal has the same value that it had during the previous sample period, i−1. In this case, the reference levels for the next sample period i+1 do not change, such that $M_{(i+1)} = M_i$. This is depicted in step 906. Alternately, during sample period i, when both comparators have outputs of logic 1, then the reference levels of both comparators are above the analog input signal level, and the reconstructed digital signal has a logic value of logic 0. In this case, the reference levels will be decreased by at least one step size prior to the next sample period i+1. Specifically, for sample period i+1, the reference levels of the comparators will be described by $M_{(i+1)} = M_i - \text{step\_size}_{(i+1)}$. This is depicted in step 908.

Figure 10:
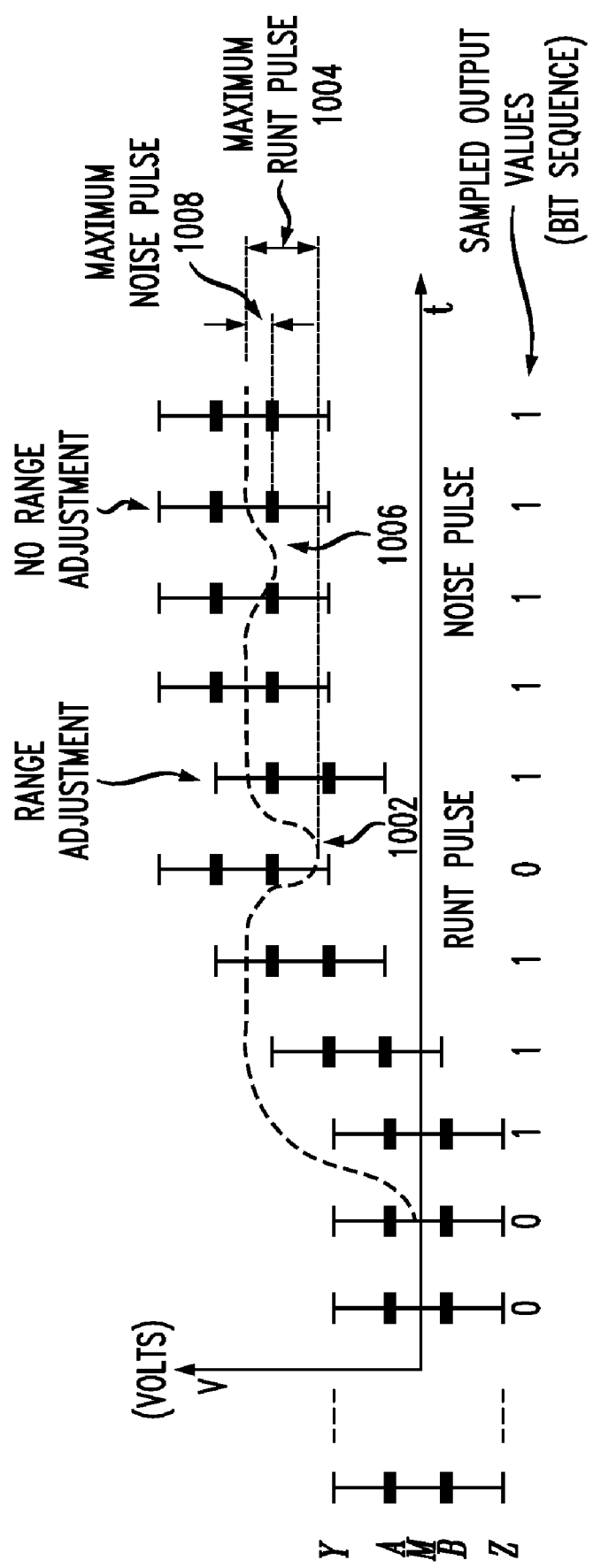
FIG. 10 graphically depicts how, using the illustrative method of FIG. 9, an exemplary dynamic range ADC samples an analog signal, adjusts its dynamic range, and determines the sampled output value, in accordance with an embodiment of the invention.

FIG. 10 graphically depicts an implementation of the illustrative method 900 of FIG. 9 in which an exemplary ADC circuit samples an analog input signal, adjusts a dynamic range of an ADC included the ADC circuit, and determines the sampled output value of the ADC, in accordance with an embodiment of the invention. With reference to FIGS. 10, A and B are indicative of reference levels of the active comparators in the ADC and are shown as heavy lines. Similarly, Y and Z are indicative of either reference levels corresponding to inactive comparators, in the case of virtual reference level shifting, or reference levels at which the active comparators can operate but are not operating during the current sample period, in the case of physical reference level shifting, and are shown as lighter lines. As previously described, M is preferably a prescribed variable reference point, such as, for example, a midpoint, between reference levels A and B.

For the dynamic range ADC circuit to assign a correct output value to each sample of the input signal, or for the ADC to sample with sufficient resolution such that some subsequent circuitry may assign the correct value to each sample, a difference in reference levels A and B, namely, A−B or B−A, is ideally less than a minimum change between two consecutive sample periods of the analog signal that represent a transition in the transmitted bit sequence (e.g., a logic 0 to a logic 1 transition or a logic 1 to a logic 0 transition). Such a small transition, often referred to as a runt pulse 1002, is common in communication systems due to, among other factors, high frequency attenuation, noise, crosstalk, ISI, etc. If the reference levels A and B of the active comparators were set such that the magnitude of A−B was greater than a magnitude of the minimum runt pulse 1004, the ADC may not detect the pulse, and thus the transition in the bit sequence could be lost. Conversely, the difference in reference levels A and B, namely, A−B or B−A, is ideally greater than a maximum change between two consecutive sample periods of the analog signal that can be caused by noise, crosstalk, ISI, etc. Such transition is referred to herein as a noise pulse 1006. If the reference levels A and B of the active comparators were set such that the magnitude of A−B was less than a magnitude of the maximum noise pulse 1008, the ADC may detect the pulse, and an extraneous transition in the output bit sequence could be added.

Figure 11:
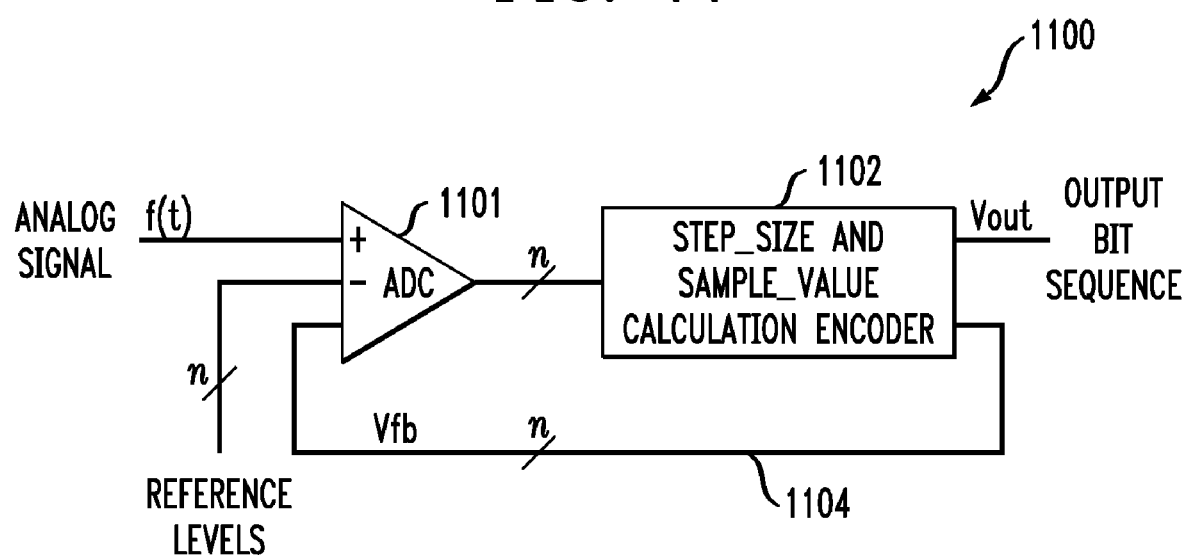
FIG. 11 is a diagram of an ADC system in accordance to one embodiment of the present invention.

One benefit of the dynamic range ADC according to embodiments of the invention is that a reduction in power consumption in the ADC can be achieved without sacrificing resolution. In accordance with another aspect of the invention, the dynamic range ADC may also provide beneficial sequence detecting capabilities. FIG. 11 is a schematic diagram depicting at least a portion of an exemplary ADC circuit 1100 comprising a dynamic range ADC 1101 and an encoder 1102, or alternative controller, coupled to the ADC. ADC 1101 preferably comprises n comparators, where n is an integer greater than 1, each comparator having a first input, which may be a non-inverting (+) input, adapted to receive an input signal, f(t), and a second input, which may be an inverting (−) input, adapted to receive a corresponding reference signal. Since there are n comparators, there are n corresponding reference signals. The ADC 1101 further includes a third input, which may be a reference level adjust input, adapted to receive a feedback control signal, Vfb, operative to control which comparators are active during a given sample period, in the case of virtual reference level shifting (FIG. 5), or to control a level of the reference signals of the active comparators, in the case of physical reference level shifting (FIG. 6). The reference level adjustment is preferably performed globally, without changing the individual reference level inputs to the ADC.

Encoder 1102 is preferably operative to receive output signals from the n comparators in the ADC 1101 and to perform step size calculation and sample value calculation as a function of the n output signals. Encoder 1102 generates an output bit sequence, Vout, of the ADC circuit 1100. The step size calculation determines what the current sampled value may be based on the previous k sampled values and the previous j comparator values. Encoder 1102 may therefore include memory operative to store previous step sizes and/or sample values. In order to control the reference levels to the comparators in ADC 1101, the step size calculated by encoder 1102 is preferably fed back to the ADC using feedback connection 1104. The feedback control signal Vfb is preferably a function of at least one of the step size and the sample value determinations. Thus, the dynamic range ADC 1101 incorporates aspects of a channel equalizer. Design parameters, such as, for example, channel impulse response, may be used to aid in the design of the dynamic range ADC circuit 1100.

The output of the dynamic range ADC need not be a hard logic 0 or logic 1, or an absolute decision regarding the correct value of a sample is not necessary. The output of the ADC 1101 can be input into additional circuitry, such as, for example, encoder 1102, to aid in determination of the output bit sequence Vout. For example, the encoder 1102 may be a maximum likelihood (ML) detector (e.g., a Viterbi decoder), although alternative encoders suitable for use with the present invention are contemplated.

At least a portion of the circuits and methodologies of the present invention may be implemented in one or more integrated circuits. In forming integrated circuits, die are typically fabricated in a repeated pattern on a surface of a semiconductor wafer. Each of the die includes a device described herein, and may include other structures or circuits. Individual die are cut or diced from the wafer, then packaged as integrated circuits. One skilled in the art would know how to dice wafers and package die to produce integrated circuits. Integrated circuits so manufactured are considered part of this invention.

An integrated circuit in accordance with the present invention can be employed in various applications and/or electronic systems which utilize an ADC. Suitable systems for implementing techniques of the invention may include, but are not limited to, personal computers, communication networks, interface networks, etc. Systems incorporating such integrated circuits are considered part of this invention. Given the teachings of the invention provided herein, one of ordinary skill in the art will be able to contemplate other implementations and applications of the techniques of the present invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. An analog-to-digital converter (ADC) circuit, comprising:
   a plurality of comparators, each of the comparators being operative to generate an output indicative of a difference between a first signal representative of an input signal applied to the ADC circuit and a corresponding reference signal; and
   a controller coupled to the plurality of comparators, the controller being operative to perform at least one of: (i) activating a subset of the plurality of comparators during a given sample period, wherein the subset of the plurality of comparators is directly dependent upon unencoded outputs of a least two of the plurality of comparators during a first set of one or more previous sample periods; and (ii) controlling levels of the corresponding reference signals of at least two of the plurality of comparators, wherein the levels of the corresponding reference signals are directly dependent upon the unencoded outputs of the at least two of the plurality of comparators during the first set of one or more previous sample periods.

2. The ADC circuit of claim 1, wherein the controller is operative to selectively activate the subset of the plurality of comparators during the given sample period, the active comparators being selected as a function of a level of the input signal.

3. The ADC circuit of claim 1, wherein the controller, during the given sample period, is operative to activate each of the plurality of comparators and to selectively adjust the levels of the corresponding reference signals as a function of the level of the input signal, an amount of change in the level of at least one of the corresponding reference signals from a sample period immediately preceding a current sample period to the current sample period being directly dependent upon an unencoded output of at least one of the plurality of comparators during the first set of one or more previous sample periods.

4. The ADC circuit of claim 3, wherein the number of active comparators during the given sample period is two.

5. The ADC circuit of claim 3, wherein the level of at least one reference signal is changed between at least two consecutive sample periods.

6. The ADC circuit of claim 1, wherein a total number of comparators in the ADC circuit is greater than the number of active comparators during the given sample period.

7. The ADC circuit of claim 1, further comprising an encoder coupled to the plurality of comparators, the encoder being operative to receive the respective outputs from the comparators and to generate an output signal which is a digital representation of the input signal.

8. The ADC circuit of claim 7, wherein a change in the level of at least one of the corresponding reference signals is performed as a function of the output signal during at least one previous sample period.

9. The ADC circuit of claim 7, wherein an amount by which the level of at least one of the corresponding reference signals changes between the current sample period and a next subsequent sample period is a function of the output signal during at least one previous sample period.

10. The ADC circuit of claim 7, wherein the encoder is operative to perform error correction.

11. The ADC circuit of claim 7, wherein the encoder is operative to determine an amount by which to change a level of at least one reference signal between a current sample period and a next subsequent sample period, and wherein the encoder provides the amount to at least one of the plurality of comparators.

12. The ADC circuit of claim 7, wherein the encoder comprises a Maximum-Likelihood detector.

13. An integrated circuit comprising at least one analog-to-digital converter circuit according to claim 1.

14. The ADC circuit of claim 1, wherein the ADC circuit is configured such that:
   (i) during a first sample period, first and second levels of corresponding reference signals applied to first and second activated comparators in the subset of the plurality of comparators, respectively, are below a level of the input signal, and wherein, during a sample period immediately following the first sample period, a third level of a corresponding reference signal applied to a third activated comparator in the subset of the plurality of comparators is a step size higher than the first level, and a fourth level of a corresponding reference signal applied to a fourth active comparator in the subset of the plurality of comparators is the step size higher than the second level; or
   (ii) during the first sample period, the first and the second levels of the corresponding reference signals applied to the first and the second activated comparators, respectively, are above the level of the input signal, and wherein, during the sample period immediately following the first sample period, the third level of the corresponding reference signal applied to the third activated comparator is the step size lower than the first level, and the fourth level of the corresponding reference signal applied to the fourth activated comparator is the step size lower than the second level; or
   (iii) during the first sample period, the first level of the corresponding reference signal applied to the first activated comparator is below the level of the input signal and the second level of the corresponding reference signal applied to the second activated comparator is above the level of the input signal, and wherein, during the sample period immediately following the first sample period, the third level of the corresponding reference signal applied to the third activated comparator is the same as the first level, and the fourth level of the corresponding reference signal applied to the fourth activated comparator is the same as the second level;

wherein a value of the step size is directly dependent upon an unencoded output of at least one of the plurality of comparators during the first set of one or more previous sample periods.

15. The ADC circuit of claim 14, wherein the first and third activated comparators are the same comparator, and wherein the second and the fourth activated comparators are the same comparator.

16. A method for reducing power consumption in an analog-to-digital converter (ADC) circuit including a plurality of comparators, each of the comparators having a corresponding reference signal associated therewith, the method comprising the steps of:

defining a plurality of regions into which an analog input signal applied to the ADC circuit is quantized;

performing at least one of: activating a subset of the plurality of comparators during a given sample period, wherein the subset of the plurality of comparators is directly dependent upon unencoded outputs of at least two of the plurality of comparators during a first set of one or more previous sample periods; and controlling levels of the corresponding reference signals of at least two of the plurality of comparators, wherein the levels of the corresponding reference signals are directly dependent upon the unencoded outputs of the at least two of the plurality of comparators during the first set of one or more previous sample periods; and generating an output signal as a function of respective outputs of active comparators in the ADC circuit during the given sample period, the output signal for the given sample period being a digital representation of the analog input signal.

17. The method of claim 16, wherein the step of activating a subset of the plurality of comparators comprises:

selecting the subset of the comparators to activate during the given sample period as a function of the level of the input signal; and determining a step size, wherein the step size is a difference between a level of a first reference signal of a first comparator, activated during a sample period immediately preceding a current sample period, to a level of a second reference signal of a second comparator activated during the current sample period; and wherein the step size is set directly dependent upon an unmodified output of at least one of the plurality of comparators during the first set of one or more previous sample periods.

18. The method of claim 16, wherein there are two active comparators during the given sample period and the step of controlling levels of the corresponding reference signals of the comparators comprises:

when a level of the analog input signal is below levels of the corresponding reference signals for a current sample period, increasing the levels of the corresponding reference signals for a next subsequent sample period by a prescribed amount and setting the output signal to a first logic level indicative of the analog input signal being above the levels of the corresponding reference signals for the current sample period;

when the level of the analog input signal is between the levels of the corresponding reference signals for the current sample period, leaving the levels of the corresponding reference signals for the next subsequent sample period unchanged from the current sample period and setting the output signal to a logic level of a next preceding sample period; and when the level of the analog input signal is greater than the levels of the corresponding reference signals for the current sample period, decreasing the levels of the corresponding reference signals for the next subsequent sample period by the prescribed amount and setting the output signal to a second logic value indicative of the analog input signal being below the levels of the corresponding reference signals for the current sample period.

19. The method of claim 16, wherein the step of generating the output signal comprises:

receiving respective outputs of the active comparators in the ADC circuit during a given sample period;

determining a value of the output signal during a current sample period as a function of at least one of: a value of the output signal during at least one preceding sample period; and an amount of reference level shifting performed in the ADC circuit during at least one preceding sample period.

20. An electronic system, comprising:

at least one integrated circuit including at least one analog-to-digital converter (ADC) circuit, the at least one ADC circuit comprising:

a plurality of comparators, each of the comparators being operative to generate an output indicative of a difference between a first signal representative of an input signal applied to the ADC circuit and a corresponding reference signal; and a controller coupled to the plurality of comparators, the controller being operative to perform at least one of: (i) activating a subset of the plurality of comparators during a given sample period, wherein the subset of the plurality of comparators is directly dependent upon unencoded outputs of at least two of the plurality of comparators during a first set of one or more previous sample periods; and (ii) controlling levels of the corresponding reference signals of at least two of the plurality of comparators, wherein the levels of the corresponding reference signals are directly dependent upon the unencoded outputs of the at least two of the plurality of comparators during the first set of one or more previous sample periods.

* * * * *